United States Patent

Curatola et al.

(10) Patent No.: US 7,923,346 B2
(45) Date of Patent: Apr. 12, 2011

(54) FIELD EFFECT TRANSISTOR STRUCTURE WITH AN INSULATING LAYER AT THE JUNCTION

(75) Inventors: Gilberto A. Curatola, Korbek-Lo (BE); Sebastien Nuttinck, Heverlee (BE)

(73) Assignee: NXP B.V., Eindhoven (NL)

( * ) Notice: Subject to any disclaimer, the term of this patent is extended or adjusted under 35 U.S.C. 154(b) by 292 days.

(21) Appl. No.: 12/097,122

(22) PCT Filed: Dec. 7, 2006

(86) PCT No.: PCT/IB2006/054666
§ 371 (c)(1),
(2), (4) Date: Sep. 22, 2008

(87) PCT Pub. No.: WO2007/069151
PCT Pub. Date: Jun. 21, 2007

(65) Prior Publication Data
US 2009/0166761 A1    Jul. 2, 2009

(30) Foreign Application Priority Data

Dec. 13, 2005  (EP) .................................. 05112076

(51) Int. Cl.
*H01L 21/331*    (2006.01)

(52) U.S. Cl. ................ 438/427; 257/408; 257/E21.431; 257/E29.266; 257/E21.619; 257/E21.634; 257/344

(58) Field of Classification Search ........................ None
See application file for complete search history.

(56) References Cited

U.S. PATENT DOCUMENTS

| | | |
|---|---|---|
| 6,198,142 B1 | 3/2001 | Chau et al. |
| 2002/0135020 A1* | 9/2002 | Skotnicki et al. ............. 257/368 |
| 2004/0038533 A1 | 2/2004 | Liang |
| 2005/0035408 A1 | 2/2005 | Wang et al. |
| 2005/0173735 A1 | 8/2005 | Li |
| 2005/0176219 A1 | 8/2005 | Kim et al. |
| 2005/0285193 A1* | 12/2005 | Lee et al. ....................... 257/347 |

OTHER PUBLICATIONS

Jurczak, M; et al "Dielectric Pockets—A New Concept of the Junctions for DECA-Nanometric CMOS Devices" IEEE Transactions on Electron Devices, vol. 48, No. 8, Aug. 2001, pp. 1770-1775.

* cited by examiner

Primary Examiner — Minh-Loan T Tran
Assistant Examiner — Fei Fei Yeung Lopez

(57) ABSTRACT

A method of making a FET includes forming a gate structure (18), then etching cavities on either side. A SiGe layer (22) is then deposited on the substrate (10) in the cavities, followed by an Si layer (24). A selective etch is then carried out to etch away the SiGe (22) except for a part of the layer under the gate structure (18), and oxide (28) is grown to fill the resulting gap. SiGe source and drains are then deposited in the cavities. The oxide (28) can reduce junction leakage current.

5 Claims, 2 Drawing Sheets

FIELD EFFECT TRANSISTOR STRUCTURE WITH AN INSULATING LAYER AT THE JUNCTION

Figure 1:
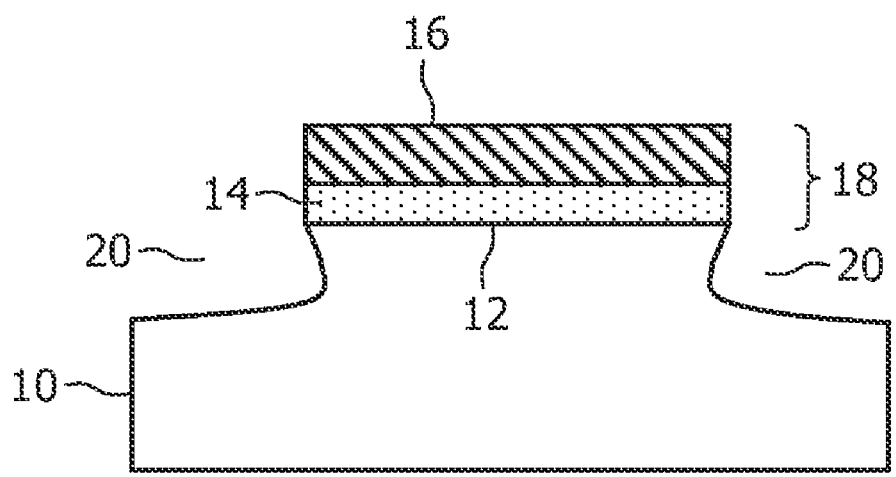

The invention relates to a semiconductor field effect transistor structure (FET) with an insulating layer at the junction and a method of making it.

A large variety of semiconductor metal oxide semiconductor field effect transistor (MOSFET) structures and manufacturing methods for them are known. There is a continuing drive to reduce the size of such transistors to increase the number of gates on a single semiconductor substrate.

As transistors get smaller a number of effects become increasingly relevant to the performance of the transistor, including leakage effects. This is especially true in short channel devices. In particular, an effect known as junction leakage becomes increasingly important. Junction leakage relates to leakage current between source or drain and the substrate, across the junction between the source (or drain) diffusion and the substrate.

Junction leakage is a particular problem for devices using a silicon germanium (SiGe) alloy source and drain, because SiGe has a reduced bandgap compared to the silicon substrate and hence the leakage current can be larger.

There is thus a need for a transistor design and method of manufacture to reduce junction leakage.

A prior art structure with this goal in mind is provided in US 2004/0038533 to Chunlin Liang. In this approach, a deep cavity is etched from the top surface of the substrate into the substrate, the cavity being wider towards the base so that it undercuts part of the top surface. A thermal oxide is then formed on the surface of the cavity, which is filled or partly filled. Source and drain implants are then formed at the region undercut by the cavity.

Unfortunately, this approach is difficult to implement in practice. The cavity that is etched needs to be the same depth as the source and drain implants and it is difficult to control the depth of the cavity. It is also particularly difficult to control the etching step forming the undercut. The major leakage in a conventional bulk MOSFET is however from the lightly doped source and drain (LDS and LDD) and this cannot be addressed. A further problem is that the approach requires a large area of silicon.

US 2005/0176219 to Kim et al is an alternative approach which uses a device isolation layer formed to reduce the leakage current. However, the isolation layer goes all the way under the active channel region. The silicon of the active channel is grown on top of SiGe, the SiGe then being removed and replaced by silicon oxide to form the isolation layer. This introduces much stress into the active channel layer. Also, the thickness of the SiGe layer means that the strain in this layer cannot be contained so dislocations and defects will appear in the silicon layer around the SiGe layer, again reducing the quality of the active channel layer.

A further alternative structure is disclosed in US 2005/0035408 (Wang et al). The process described is very complicated.

Jurczak et al describe an alternative approach in "Dielectric Pockets—A New Concept of the Junctions for Deca-Nanometric CMOS Devices", IEEE Transactions on Electron Devices volume 48 number 8 2001, pages 1770 to 1774. In this approach, a buried spacer which the authors refer to as a dielectric pocket is implanted under the LDD and adjacent to the highly doped drain (HDD). Again however, manufacture is complicated and the buried spacer does not impede junction leakage current over much of the source and drain structures.

Accordingly, there remains a need to reduce junction leakage current in FETs.

According to the invention there is provided a method of manufacturing a semiconductor transistor, comprising:
forming a gate oxide layer on the first major surface of a silicon semiconductor substrate;
forming a gate on the gate oxide layer;
etching source and drain cavities in deep extension regions on both sides of the gate into the first major surface of the semiconductor substrate;
growing a SiGe layer on the walls of the deep extension region;
growing a silicon layer on the SiGe layer;
selectively etching the SiGe layer to remove the SiGe layer, leaving the part of the SiGe layer adjacent to the gate oxide layer in place, the remaining part of the SiGe layer forming a layer cavity;
filling the layer cavity with insulator; and
growing source and drain layers in source and drain cavities the deep extension regions on opposite sides of the gate.

By manufacturing a semiconductor device as described, the oxide layer follows the junction and hence greatly reduces the junction leakage current, since the isolation layer is present over a large fraction of the area of the junction. This may be compared, for example, with the approach of US 2005/0176219 in which a thick isolation region is formed. It will be noted that in US 2005/0176219 large parts of the source and drain regions (especially the higher doped parts) are not isolated at all since the isolation region is under the channel, which means that there is still a large area for junction leakage current to flow.

A further benefit of the invention is that by following the junction the oxide layer is present where it is most effective. The electric field is higher at curved parts of the junction, and so the leakage current is highest there. Prior art approaches have tended to provide a trench at a particular location. Inevitably, in such prior art approaches the trench does not follow the junction especially in the curved regions, so such prior art approaches do not help reduce leakage current precisely where the help is most needed.

The device also effectively acts as local silicon on insulator device which can further improve short channel effects.

In preferred embodiments the source and drain layers are of SiGe; preferably filling the cavities. The invention is of particular use in such devices. In such transistors, it is beneficial to increase the percentage of Ge in the SiGe which increases the amount of strain in the channel. Unfortunately, the higher the amount of Ge, the lower the band gap and hence the higher the leakage current. The inventors have realised that for SiGe transistors the leakage in the highly doped region therefore becomes more important, and indeed can become comparable to the lightly doped region leakage current; this is especially true in view of the fact that the highly doped regions are in practice much larger than the lightly doped regions—they are typically one order of magnitude larger.

None of the prior art documents address this specific problem of transistors with SiGe sources and drains.

The step of filling the cavity may be a step of oxidising silicon to form silicon oxide in the cavity.

The SiGe layer under the silicon layer may be formed to have a thickness of 5 nm to 25 nm. Thus, the SiGe layer formed on the walls of the deep extension region may be thin, which ensures that the SiGe layer can be effectively held as a strained layer without leaving defects The silicon layer may be grown on the SiGe layer to a thickness of 5 nm to 25 nm.

According to another aspect, the invention also relates to a semiconductor effect transistor transistor, comprising:

a silicon semiconductor substrate with a first major surface;

a gate oxide layer on the first major surface;

a conducting gate over the gate oxide layer;

opposed source and drain regions formed in opposed deep extension regions on opposite sides of the gate), the source and drain regions extending into the substrate from the first major surface; and a filled layer in the substrate following the junction of the source and drain regions and the substrate, wherein the filled layer has a first region adjacent to the gate oxide layer of SiGe and the remainder of the filled layer is of insulator.

The invention will now be described, purely by way of example, with reference to the accompanying drawings, in which:

FIGS. 1 to 4 show in side view steps in a method according to an embodiment of the invention.

Referring to FIG. 1, a silicon substrate 10 is provided, and a gate oxide layer 14 grown on a first major surface 12 of the silicon substrate 10. A gate 16 is deposited on the gate oxide layer 14; the gate is of conducting material such as metal, metal alloy or polysilicon. The gate 16 and gate oxide 14 are patterned to define the gate structure 18.

Deep extension regions 20 are then etched on either side of the gate structure 18—at this stage the deep extension regions 20 are etched source and drain cavities. Optionally, this etching step is self-aligned using the gate 16 as a mask.

This leads to the structure shown in FIG. 1.

Figure 2:
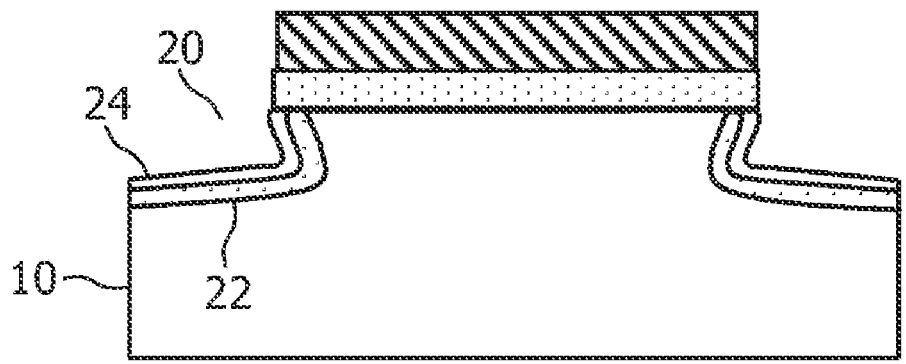
Figure 3:
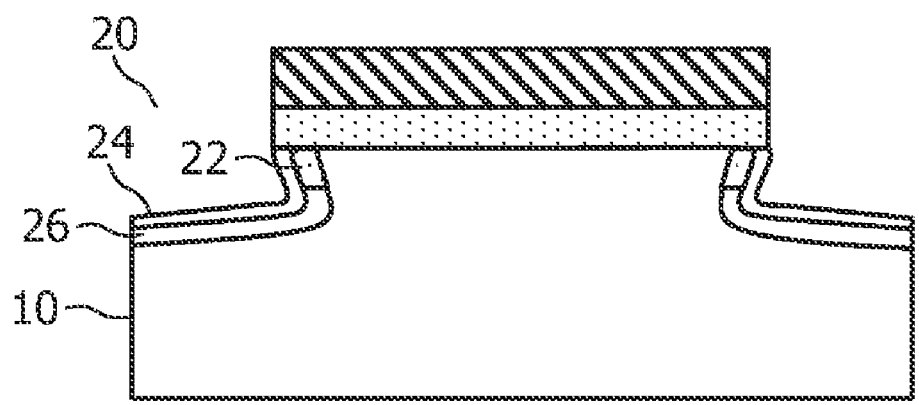
Figure 4:
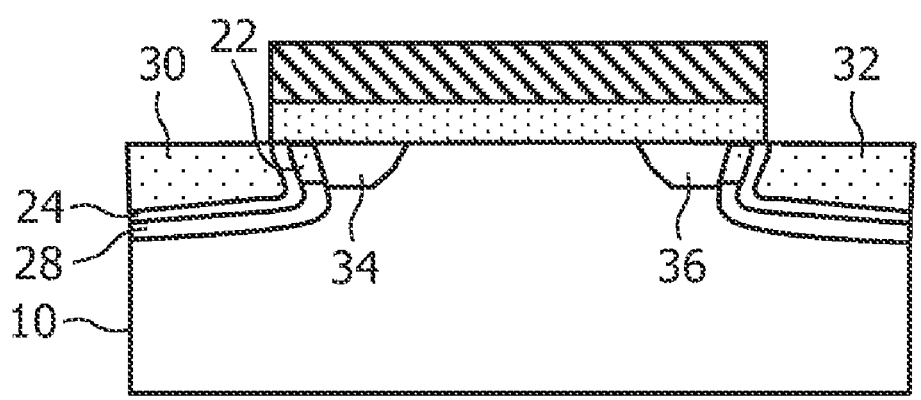

A thin silicon-germanium (SiGe) layer 22 is then deposited on the walls of the deep extension region cavities 20 on the substrate 10. In the specific embodiment described, the SiGe layer is 80% Si and 20% Ge, but this may be varied as discussed below. A thin layer of silicon 24 is then deposited on the thin SiGe layer 22, as illustrated in FIG. 2.

A selective etch is then carried out; the etch selectively etches SiGe over Si. The etch may be, for example, a selective wet etch. An example of a selective wet etchant with a high selectivity that etches SiGe selectively over Si is ammonium hydroxide, hydrogen peroxide and water in a 1:1:4 ratio.

The etch is carried out a carefully controlled time to partially, but not completely, etch away the thin SiGe layer 22, leaving a layer cavity 26. A length of the thin SiGe layer 22 however remains under the oxide layer 14. In preferred embodiments, this length is 5 to 20 nm, preferably 5 to 10 nm, which is sufficient to provide a current path and which is low enough to provide a good reduction in junction current. This results in the structure of FIG. 3.

Silicon dioxide 28 is then grown to fill the layer cavity 26. The oxide 28 and the remaining SiGe layer 22 thus constitute together a filled layer, the filled layer having SiGe 22 adjacent to the gate oxide 14 and oxide 28 for the remainder. The oxide is silicon dioxide—the term silicon oxide is also used to indicate that the oxide grown need not be stochiometric An SiGe source 30 and drain 32 are then grown to fill the source and drain cavities (the deep extension regions) 20 to form the source and drain of the MOSFET. These impose a compressive stress in the channel. The SiGe is 60% to 90% Si, 10% to 40% Ge, with values of Ge from 15% to 25% being particularly preferred. The source and drain are heavily doped to be conductive, either n+ type or p+ type depending on the desired transistor type.

A lightly doped source 34 and drain 36 are formed by implantation adjacent to the source 30 and drain 32 respectively, with the same conductivity type as the source and drain. The lightly doped source and drain 34,36 are of Si, which has a high band gap compared to the SiGe source and drain 30,32. The lightly doped source and drain (34, 36) have the same conductivity type as the SiGe source and drain (30, 32).

Contacts to the SiGe source 30, SiGe drain 32 and gate 16 are then made as in conventional processes to complete the MOSFET. Further processing can be made, as will be appreciated by those skilled in the art, for example to provide interconnection layers and the like.

The resulting structure has a filled layer (22, 28) following the junction of the SiGe source and drain 30,32 and the silicon substrate 10, the filled layer being spaced from the SiGe source and drain 30, 32 by the thin Si layer 24. For much of its length, the filled layer is of an insulator (28), oxide, which prevents leakage current from flowing in this part of the filled layer. The SiGe layer 22 at the gate end of the filled layer conducts, allowing current to pass between source and drain when the transistor is switched on.

Accordingly, the transistor according to the invention has a significantly reduced junction leakage current compared to alternative transistors which use a SiGe source and drain, especially in the HDD region.

In particular, such transistors with an SiGe region have significantly higher leakage current from the SiGe region and so the invention, which reduces the leakage between the region and body, is of particular benefit.

The SiGe 22 that remains ensures that the channel formed adjacent to the gate oxide with the transistor in use is not impeded by the oxide 28.

A benefit of the approach used is that it can readily be applied to a conventional form of MOSFET, without requiring complex trench structures or the like.

Those skilled in the art will realise that the embodiment described is not the only approach, and modifications can be introduced if required.

The approach can be used with transistors of various sizes, and is simple enough to be manufactured even at the smallest scale.

The thickness of the thin Si layer 24 and the thin SiGe layer 22 and hence the filled layer in the finished structure can be varied depending on the process used. For example, the SiGe layer 22 and the filled layer 22,28 can have a thickness of 2 to 25 nm, preferably 5 to 25 nm, and the thin Si layer also preferably has a thickness of 5 nm to 25 nm.

The exact thickness used depends on the alloy composition, since the larger the amount of Ge in the SiGe alloy the more strained the SiGe layer 22 is and hence the thinner the maximum thickness of this layer becomes to avoid introducing excessive stress in the structure. With 20% Ge, a layer thickness of SiGe of less than 15 nm, ideally less than 10 nm, is preferable to avoid stress. With lower amounts of Ge, higher thicknesses are possible.

Although the invention has been described with a specific form of MOSFET, any suitable structure can be used if required.

Any suitable semiconductor patterning process may be used for forming the layers, and in particular the gate pattern.

The SiGe source and drain regions 30,32 can be replaced by alternative material, such as Si grown in the deep extension regions.

Those skilled in the art will realise that the invention can be used to produce p-type or n-type transistors with suitable doping of the source, drain and body.

The invention claimed is:

1. A method of manufacturing a semiconductor transistor, comprising:
    forming a gate oxide layer on a first major surface of a silicon semiconductor substrate;
    forming a gate on the gate oxide layer;
    etching source and drain cavities on both sides of the gate in a deep extension region into the first major surface of the semiconductor substrate;
    growing a SiGe layer on the walls of the deep extension region;
    growing a silicon layer on the SiGe layer;
    selectively etching the SiGe layer to remove the SiGe layer, leaving the part of the SiGe layer adjacent to the gate oxide layer in place, the remaining part of the SiGe layer forming a cavity;
    filling the cavity with insulator; and
    growing source and drain layers in the source and drain cavities in the deep extension regions on opposite sides of the gate.

2. A method according to claim 1 wherein the source and drain layers are of SiGe.

3. A method according to claim 1 wherein the step of filling the layer cavity is a step of oxidising silicon to form silicon oxide in the cavity.

4. A method according to claim 1 wherein the SiGe layer under the silicon layer has a thickness of 5 nm to 25 nm.

5. A method according to claim 1 wherein the silicon layer grown on the SiGe layer has a thickness of 5 nm to 25 nm.

* * * * *